United States Patent
Hwang et al.

(10) Patent No.: US 8,941,191 B2
(45) Date of Patent: Jan. 27, 2015

(54) METHOD OF ACTUATING AN INTERNALLY TRANSDUCED PN-DIODE-BASED ULTRA HIGH FREQUENCY MICROMECHANICAL RESONATOR

(75) Inventors: Eugene Hwang, Melrose, MA (US); Sunil Ashok Bhave, Ithaca, NY (US)

(73) Assignee: Cornell University, Ithaca, NY (US)

( * ) Notice: Subject to any disclaimer, the term of this patent is extended or adjusted under 35 U.S.C. 154(b) by 178 days.

(21) Appl. No.: 13/193,685

(22) Filed: Jul. 29, 2011

(65) Prior Publication Data
US 2012/0194282 A1    Aug. 2, 2012

Related U.S. Application Data

(60) Provisional application No. 61/369,124, filed on Jul. 30, 2010.

(51) Int. Cl.
  *H01L 29/84* (2006.01)
  *H03H 9/24* (2006.01)
  *H03H 3/007* (2006.01)
  *H03H 9/02* (2006.01)

(52) U.S. Cl.
  CPC ........... *H03H 9/2405* (2013.01); *H03H 3/0072* (2013.01); *H03H 2009/02496* (2013.01)
  USPC ................... 257/414; 257/415; 257/E29.324; 257/E29.327

(58) Field of Classification Search
  CPC ............... H03H 9/2405; H03H 3/0072; B81B 2201/0271
  USPC .................................................. 257/414, 415
  See application file for complete search history.

(56) References Cited

U.S. PATENT DOCUMENTS

| | | | |
|---|---|---|---|
| 6,043,517 A | 3/2000 | Presting et al. | |
| 6,888,662 B2 * | 5/2005 | Abu-Ageel | 359/290 |
| 7,692,358 B2 | 4/2010 | Kvisteroy et al. | |
| 2004/0081386 A1 | 4/2004 | Morse et al. | |
| 2009/0194830 A1 * | 8/2009 | Ransley et al. | 257/415 |
| 2014/0077898 A1 * | 3/2014 | Pensala et al. | 333/187 |

FOREIGN PATENT DOCUMENTS

| | | |
|---|---|---|
| JP | 2004516604 | 6/2003 |
| WO | 2010040873 A1 | 4/2010 |

OTHER PUBLICATIONS

Hwang et al., PN-Diode Transduced 3.7-GHZ Silicon Resonator, IEEE, 2010, (208-211).
Hwang et al., Transduction of High-Frequency Micromechanical Resonators Using Depletion Forces in p-n Diodes, IEEE Transactions on Electron Devices, May 5, 2011 (7 pages).

* cited by examiner

*Primary Examiner* — Jerome Jackson, Jr.
*Assistant Examiner* — Paul Budd
(74) *Attorney, Agent, or Firm* — Wayne F. Reinke, Esq.; Heslin Rothenberg Farley & Mesiti P.C.

(57) ABSTRACT

A radio frequency microelectromechanical (RF MEMS) device can comprise an actuation p-n junction and a sensing p-n junction formed within a semiconductor substrate. The RF MEMS device can be configured to operate in a mode in which an excitation voltage is applied across the actuation p-n junction varying a non-mobile charge within the actuation p-n junction to modulate an electric field acting upon dopant ions and creating electrostatic forces. The electrostatic forces can create a mechanical motion within the actuation p-n junction. The mechanical motion can modulate a depletion capacitance of the sensing p-n junction, thereby creating a motional current. At least one of the p-n junctions can be located at an optimal location to maximize the efficiency of the RF MEMS device at high resonant frequencies.

3 Claims, 8 Drawing Sheets

METHOD OF ACTUATING AN INTERNALLY TRANSDUCED PN-DIODE-BASED ULTRA HIGH FREQUENCY MICROMECHANICAL RESONATOR

CROSS-REFERENCE TO RELATED APPLICATIONS

This application claims priority benefit of U.S. Provisional Patent Application Ser. No. 61/369,124, filed Jul. 30, 2010, the disclosure of which in its entirety is hereby incorporated herein by reference.

GOVERNMENT RIGHTS STATEMENT

This invention was made with Government support under grant number W911QX-07-C-0086 awarded by the Army Research Laboratories. The Government has certain rights in the invention.

FIELD OF THE INVENTION

This invention relates generally to microelectromechanical devices and, more specifically, to radio frequency microelectromechanical resonators.

BACKGROUND OF THE INVENTION

The potential of micromechanical devices as high quality factor resonators has been recognized since the seminal paper by Nathanson et al. describing the resonant gate transistor [1]. Continued research in micromechanical resonators has since pushed resonant frequencies into the multi-gigahertz range while improving transduction efficiency and reducing motional impedance.

SUMMARY OF THE INVENTION

In one aspect, there is provided a radio frequency microelectromechanical (RF MEMS) device comprising an actuation p-n junction and a sensing p-n junction formed within a semiconductor substrate. The RF MEMS device can be configured to operate in a mode in which an excitation voltage is applied across the actuation p-n junction varying a non-mobile charge within the actuation p-n junction to modulate an electric field acting upon dopant ions and creating electrostatic forces. The electrostatic forces can create a mechanical motion within the actuation p-n junction. The mechanical motion can modulate a depletion capacitance of the sensing p-n junction, thereby creating a motional current. At least one of the p-n junctions can be located at an optimal location to maximize the efficiency of the RF MEMS device at high resonant frequencies.

In one embodiment, the mechanical motion within the actuating p-n junction can occur in a direction orthogonal to the substrate plane.

In one embodiment, the mechanical motion within the actuating p-n junction can occurs in a direction parallel to the substrate plane.

In one embodiment, the semiconductor substrate can be provided by a monocrystalline silicon wafer.

In one embodiment, at least one of the p-n junctions can be located at a minimum displacement location.

In one embodiment, the RF MEMS device can further comprise two conductive pads formed on the surface of the semiconductor substrate. One conductive pad can be electrically coupled to the sensing p-n junction, and the other conductive pad can be electrically coupled to the actuation p-n junction.

In one embodiment, the RF MEMS device can be configured to operate as a high-Q resonator.

In one embodiment, the actuation p-n junction can be reverse-biased.

In one embodiment, the thickness of said semiconductor substrate can be chosen to achieve a desired resonant frequency.

In another aspect, there is provided an RF MEMS device comprising an actuation p-n junction and a sensing p-n junction formed within a semiconductor substrate. An equivalent circuit model of the RF MEMS device can comprise a first shunt capacitance equivalent to a depletion capacitance of the sensing junction and a second shunt capacitance equivalent to a depletion capacitance of the actuation junction. The equivalent circuit model can further comprise a motional capacitance, a motional impedance, and a motional inductance connected in series with the first shunt capacitance and the second shunt capacitance. The equivalent circuit model can further comprise a third shunt capacitance connected in series with the first shunt capacitance and the second shunt capacitance.

In another aspect, there is provided a method, the method comprising providing a radio frequency microelectromechanical (RF MEMS) device. The device comprises a semiconductor substrate, an actuation p-n junction and a sensing p-n junction, each located within the semiconductor substrate at a point of minimum displacement with respect to a mechanical mode shape. The method further comprises actuating the actuation p-n junction, the actuating causing a mechanical motion in the actuation p-n junction, the mechanical motion causing a motional current in the sensing p-n junction.

In one embodiment, the RF MEMS device can be configured to operate as a high-Q resonator.

In another aspect, there is provided a method of manufacturing an RF MEMS device. The method can comprise the steps of selectively doping a semiconductor-on-insulator (SOI) wafer using boron implantation to create two p-n junctions, annealing the SOI wafer to achieve a desired junction depth, etching a device layer of the SOI wafer to define a resonator and two pads, depositing and etching a conductive layer to define interconnect and pad structures, and releasing the device layer.

In one embodiment, the device can be etched by a reactive ion etch of a monocrystalline device layer of an SOI wafer.

In one embodiment, the desired junction depth can be equal to 0.65 µm.

In one embodiment, the thickness of the device layer can be equal to 1.3 µm.

In one embodiment, the resistivity of the device layer is less than 0.006 Ω·cm.

In one embodiment, the conductive layer can be provided by a 50-nm chromium layer and a 100-nm aluminum layer.

In one embodiment, the step of releasing said device layer can be performed by hydrogen fluoride (HF) etching.

In one embodiment, the thickness of said device layer of SOI wafer can be chosen to achieve a desired resonant frequency.

In one embodiment, the RF MEMS device can be configured to operate as a high-Q resonator.

In one embodiment, at least one of the p-n junctions can be located at a minimum displacement location.

BRIEF DESCRIPTION OF THE DRAWINGS

The features described herein can be better understood with reference to the drawings described below. The drawings are not necessarily to scale, emphasis instead generally being placed upon illustrating the principles of the invention. In the drawings, like numerals are used to indicate like parts throughout the various views.

DETAILED DESCRIPTION OF THE INVENTION

In one embodiment, there is provided a radio frequency (RF) microelectromechanical (MEMS) resonator actuated by electrostatic forces acting on the immobile charge within the depletion region of a reverse-bias pn-diode. Due to the internal nature of depletion-layer transduction (i.e., the force is applied within the resonator), such resonators can be efficiently actuated at high frequencies when the junction is placed at optimal locations within the resonator [2].

Figure 1:
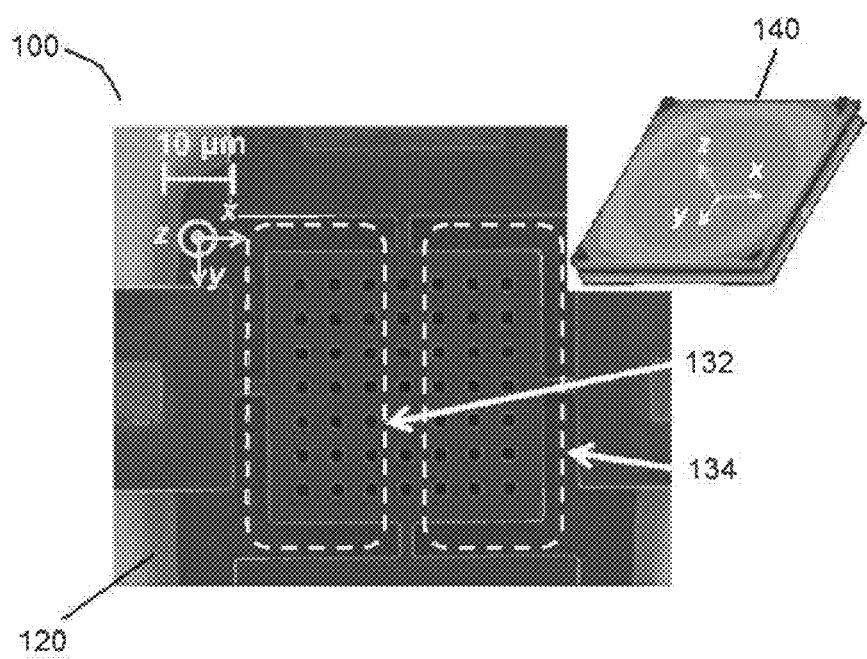
FIG. 1 schematically illustrates a scanning-electron-microscopic image of a RF MEMS device.

FIG. 1 schematically illustrates a scanning-electron-microscopic image a RF MEMS device 100 comprising actuation p-n junction 132 and sensing p-n junction 134 formed within semiconductor substrate 120. Device 100 can be configured to operate in a mode in which an excitation voltage is applied across actuation p-n junction 132 causing the nonmobile charge within the junction to produce an electric field which acts upon the dopant ions and creates electrostatic forces. The resonant frequency of RF MEMS device 100 can be determined by the semiconductor substrate thickness. The thickness displacement amplitude of the resonant mode shape is shown in the inset plot 140.

Figure 2:
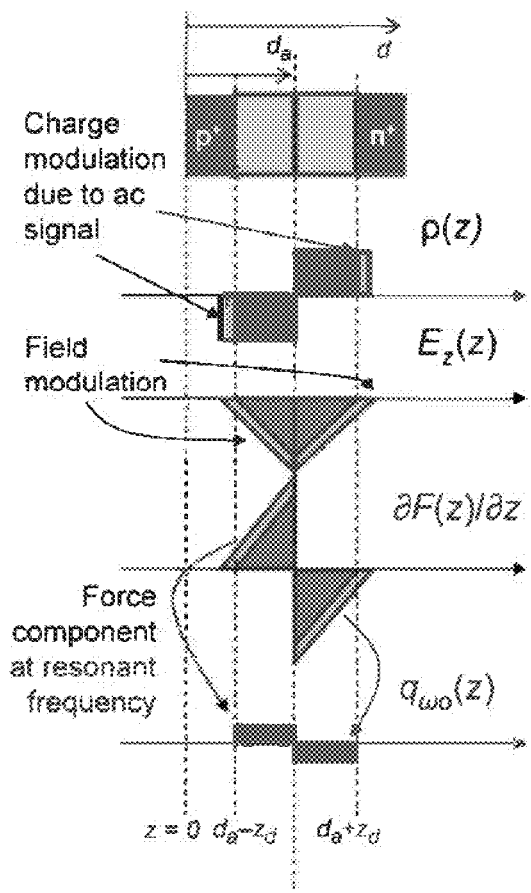
FIG. 2 schematically illustrates electrostatic force distribution within the RF MEMS device.

The electrostatic force distribution schematically shown in FIG. 2, illustrating actuation in the input junction. FIG. 2 shows the charge density p, electric field in the thickness direction $E_z$, and force component at resonant frequency $q_{\omega 0}$ throughout the structure. Assuming an abrupt symmetric junction profile, the expressions for the charge distribution $\rho(z)$, electric field $E_z(z)$, and the force distribution $\partial F/\partial z$ can be given by $$\rho(z) = \begin{cases} -eNA_j, & -z_d < z < 0 \\ eNA_j, & 0 < z < z_d \end{cases} \quad (1)$$

$$E_z(z) = \begin{cases} -\frac{eNA_j}{\varepsilon_{si}\varepsilon_0}(z_d + z), & -z_d < z < 0 \\ \frac{eNA_j}{\varepsilon_{si}\varepsilon_0}|(z - z_d), & 0 < z < z_d \end{cases} \quad (2)$$

$$\frac{\partial F}{\partial z} = \begin{cases} \frac{e^2 N^2 A_j}{\varepsilon_{si}\varepsilon_0}(z_d + z), & -z_d < z < 0 \\ \frac{e^2 N^2 A_j}{\varepsilon_{si}\varepsilon_0}(z - z_d), & 0 < z < z_d \end{cases} \quad (3)$$

where e is the elementary charge, N is the symmetric doping concentration, $\varepsilon_{si}$ is the relative permittivity of silicon, $\varepsilon_0$ is the permittivity of free space, $A_j$ is the junction area, and $2z_d$ is the junction depletion width given by the expression $$z_d(v_{in}) = \sqrt{\frac{\varepsilon_{si}\varepsilon_0}{eN}(\Phi_{bi} - V_{DC} - v_{in}(t))} \quad (4)$$

where $\Phi_{bi}$ is the junction built-in voltage.

Equations (1)-(4) indicate that this function is strongly nonlinear with the input AC voltage described by $v_{in} = v_0 e^{-j\omega 0 t}$. If $v_0 \ll \Phi_{bi} - V_{DC}$, then (3) can be linearized around the bias point, yielding the distributed force at the excitation frequency $$q_{\omega_o}(z, t) = \begin{cases} \frac{(eN)^{3/2} A_j}{2\sqrt{\varepsilon_{si}\varepsilon_0(\Phi_{bi} - V_{DC})}} v_o e^{-j\omega_o t}, & -z_d < z < 0 \\ -\frac{(eN)^{3/2} A_j}{2\sqrt{\varepsilon_{si}\varepsilon_0(\Phi_{bi} - V_{DC})}} v_o e^{-j\omega_o t}, & 0 < z < z_d. \end{cases} \quad (5)$$

This force distribution yields the following equation of motion:

$$\rho A \frac{\partial^2 u(z,t)}{\partial t^2} - bA \frac{\partial^3 u(z,t)}{\partial t \partial z^2} - EA \frac{\partial^2 u(z,t)}{\partial z^2} = q_{\omega_o}(z - d_a, t). \quad (6)$$

Here, $\rho$ is the mass density, E is the Young's Modulus, b is the loss factor, $d_a$ is the location of the actuation junction, A is the resonator cross-sectional area, and u(z,t) is the displacement field within the resonator. This field can be described by $$u(z, t) = U_o \cos\left(\frac{n\pi z}{d}\right) e^{-j\omega_o t}$$

From this point forward, the subscripts a and s are used herein to differentiate between parameters of the actuation and sensing junctions, respectively. The spatial shift of the force distribution is necessary since the expressions for the force distribution assume the junction is located at z=0. This shift does not change the analytical form of any of these expression's, only the ranges in which they apply. Multiplying equation (6) by the mode shape and integrating over the thickness d of the resonator allows one to find the electromechanical transduction efficiency of the actuation junction $$\eta_a = \frac{2d A_j}{n\pi} \frac{eN_a}{z_{d0,a}} \sin\left(\frac{n\pi d_a}{d}\right) \sin^2\left(\frac{n\pi z_{d0,a}}{2d}\right) \quad (7)$$

where $z_{d0,a} = z_{d,a}(v_{in} = 0)$.

Using a two-port configuration, a similar pn-junction 134 can be used to sense the motion at the output (see FIG. 1). The mechanical motion can modulate the depletion capacitance of sensing p-n junction 134, thus creating a motional current. This motional current can be described by $$i_m = V_{j,s} \frac{\partial C_j}{\partial t} = \eta_s \dot{u}(z, t). \quad (8)$$

As noted herein supra, RF MEMS device 110 can be efficiently actuated at high frequencies when the actuation and sensing junctions are placed at optimal locations within the resonator. To achieve direct actuation of a longitudinal bulk mode resonator using pn-diodes without Poisson ratio penalty (caused by converting perpendicular stress into stress in the direction of motion), the p-n diode should be oriented in the direction of the main resonant mode. In such a configuration, depending on how symmetrically doped the diode is, the optimal locations of the actuation and sensing junctions with respect to the frequency setting dimension will change. For a completely symmetric p-n junction, the optimal locations of the actuation and sensing junctions are at displacement nodes. When the junctions are placed at optimal locations, the transduction efficiency increases with increasing frequency.

Figure 3:
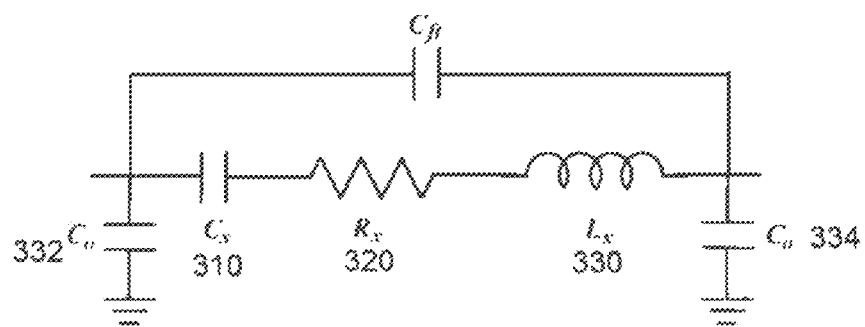
FIG. 3 schematically illustrates an equivalent Butterworth-Van Dyke (BVD) circuit model of the RF MEMS device.

An equivalent Butterworth-Van Dyke (BVD) circuit model of the RF MEMS device 100 is now being described with references to FIG. 3. The model can be useful for incorporating the RF MEMS device into other electrical systems.

Assuming small displacement ($U_o \ll W_{d,s}$), the capacitive sensing efficiency can be expressed as follows:

$$\eta_s = \frac{\varepsilon_{si}\varepsilon_0(\Phi_{bi,s} - V_{DC,s})A_j}{2z_{d0,a}} \sin\left(\frac{n\pi d_s}{d}\right)\sin\left(\frac{n\pi z_{d0,s}}{d}\right). \quad (9)$$

Defining the motional impedance to be $R_X \equiv v_o/i_m$, this can be expressed as $$R_X = \frac{n\pi A\sqrt{E\rho}}{2Q}\frac{1}{\eta_a\eta_s}, \quad (10)$$

where $$Q = \frac{L}{n\pi}\frac{\sqrt{E\rho}}{b}.$$

Equations (7)-(10) show the strong dependence of the motional impedance on the junction locations and the depletion layer widths, similar to what is shown in [2].

Thus, to maximize the efficiency of RF MEMS device 100 at high resonant frequency, the junctions should be placed at minimum displacement locations (maximum strain locations). It is also true that the motional impedance will exhibit a minimum near frequencies where the depletion width approaches half of the acoustic wavelength.

The rest of the Butterworth-Van Dyke model is obtained by using the expressions for $L_X$ and $C_X$ given by $$L_X = \frac{\rho A d}{2}\frac{1}{\eta_a\eta_s}, \quad (11)$$

$$C_X = \frac{2d}{n^2\pi^2 EA}\eta_a\eta_s.$$

As is the case with other electrostatically actuated resonators, there is a static capacitance associated with the transducer. For this resonator, the static capacitance is equal to the depletion capacitance given by $$C_o = \frac{\varepsilon_{si}\varepsilon_0 A_j}{2z_{d0}} = \sqrt{\frac{\varepsilon_{si}\varepsilon_0 eN|}{(\Phi_{bi}-V_{DC})}}\frac{A_j}{2}. \quad (12)$$

This capacitance usually sets the sensitivity of the resonance in electrostatically transduced resonators, but the dual p-n junction configuration used in the resonator may make possible some self-gain mechanism (e.g., BJT configuration) to boost the resonant signal, as demonstrated in air-gap FET sensing [3].

Note that the preceding analysis assumes quasi-static electrical behavior, i.e., the charge carriers are able to respond within a time much shorter than the period of the input stimulus. This requires both junctions to be in reverse bias where electrical dynamic behavior is governed by majority carriers. Dynamics in forward bias are governed by minority carriers, which respond much more slowly.

Thus, an equivalent Butterworth-Van Dyke (BVD) circuit model of the RF MEMS device 100 can comprise a motional capacitance 310, a motional impedance 320, and a motional inductance 330, all connected in series, as illustrated by FIG. 3. In addition to these series-resonant circuit components, the model can further comprise two shunt capacitances 332, 334 at the input and the output, which are equivalent to the junction depletion capacitances as follows:

$$C_{o,a} = \sqrt{\frac{\varepsilon_{si}\varepsilon_0 eN_a A_{j,a}}{4(\Phi_{bi,a} - V_{DC,a})}} \quad (13)$$

$$C_{o,s} = \sqrt{\frac{\varepsilon_{si}\varepsilon_0 eN_s A_{j,s}}{4(\Phi_{bi,s} - V_{DC,s})}}.$$

Using the above described BVD model allows for an easy simulation of the RF MEMS device in conventional circuit simulators, greatly simplifying the design of oscillators and filters using these devices.

Figure 4A:
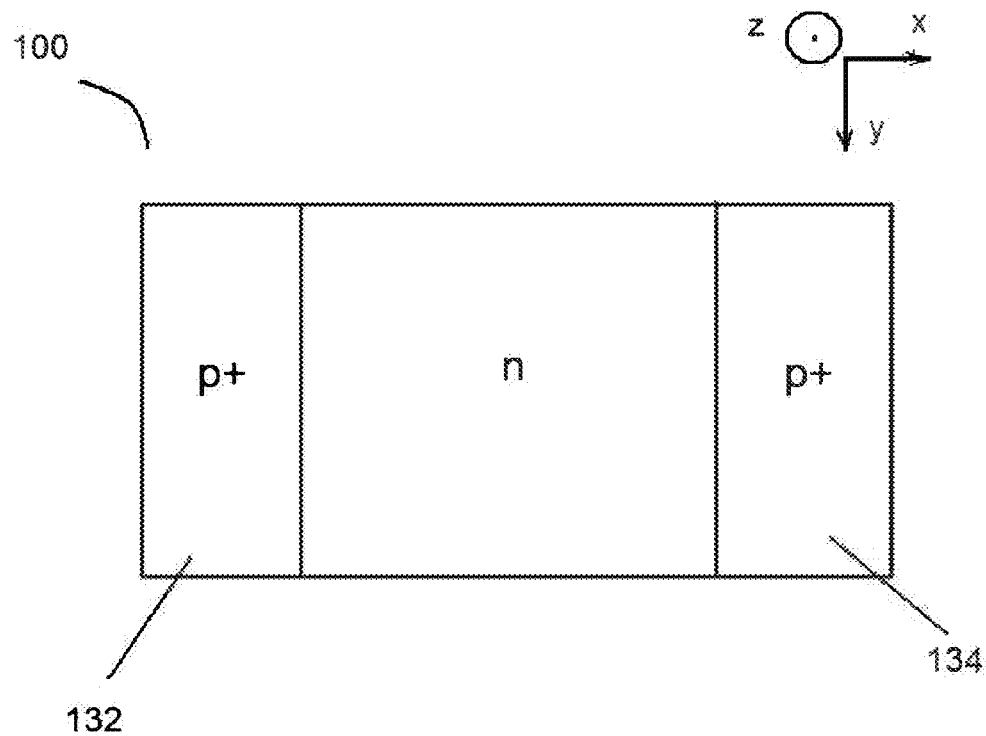
FIGS. 4-5 schematically illustrate various embodiments of the RF MEMS device.

As noted herein supra, in one embodiment, RF MEMS device 100 can be designed to operate in the vertical motion mode, as schematically shown in FIGS. 4a (top view) and 4b (cross section view). RF MEMS device 100 can comprise actuating p-n junction 132 and sensing p-n junction 134. The positions of the two p-n junctions within the placement substrate 120 dictate that that mechanical motion created by electrostatic forces within actuating p-n junction 134 occur in the direction orthogonal to the substrate plane (z-direction). The resonant frequency of RF MEMS device 100 in the vertical motion mode is defined by the device layer thickness.

Figure 5A:
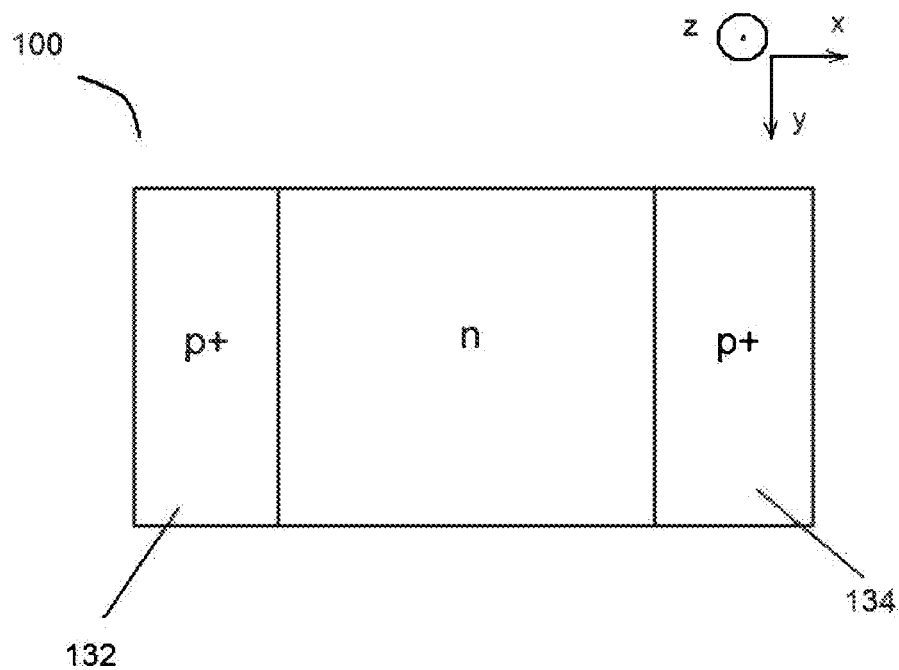
Figure 5B:
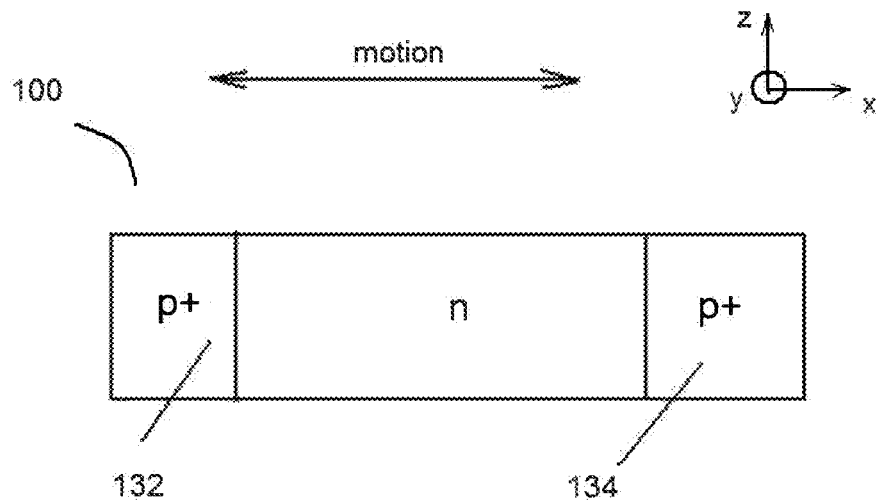

In another embodiment, RF MEMS device 100 can be designed to operate in the lateral motion mode, as schematically shown in FIGS. 5a (top view) and 5b (cross section view). RF MEMS device 100 can comprise actuating p-n junction 132 and sensing p-n junction 134. The positions of the two p-n junctions within the placement substrate 120 dictate that that mechanical motion created by electrostatic forces within actuating p-n junction 134 occur in the direction of the substrate plane (x-direction). The resonant frequency of RF MEMS device 100 in the lateral motion mode is defined by the device layer dimension in the lateral (parallel to the substrate plane) direction. In this case also, the optimal location of a symmetrically doped p-n junction can be at a zero-displacement node.

In another aspect, a single chip can comprise many different lateral motion mode resonators having different resonant frequencies.

Figure 4B:
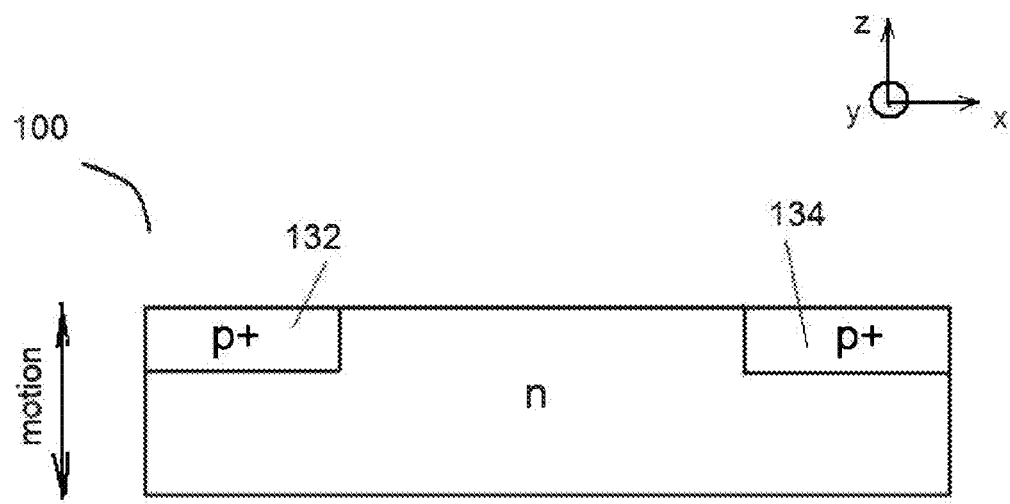
Figure 6:
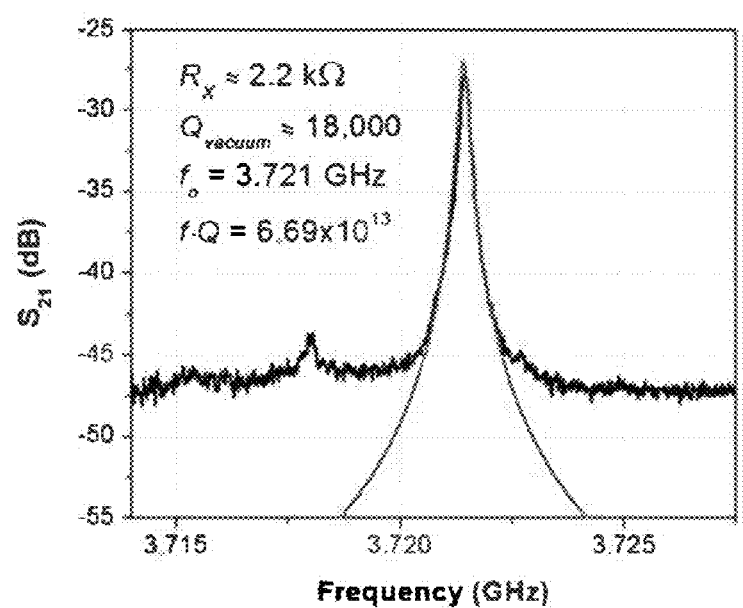
FIGS. 6-7 schematically illustrate experimental results obtained by the inventors.
Figure 7:
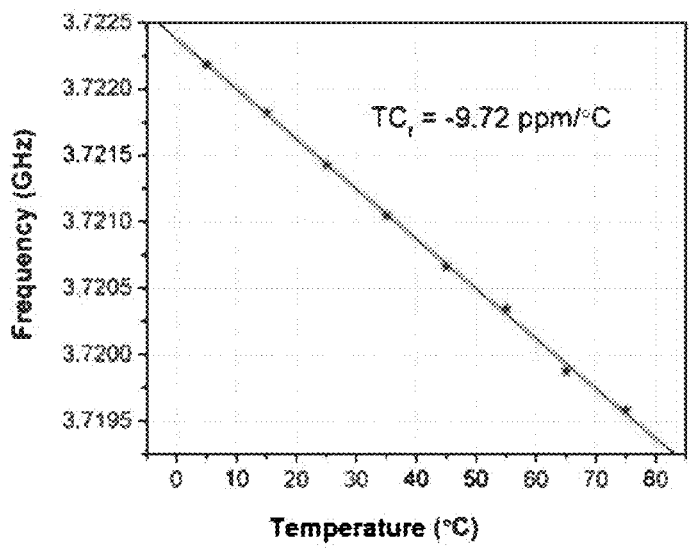

Experimental results obtained by the inventors are now being described with references to FIGS. 6-7. High frequency measurements were completed using an RF network analyzer with 50Ω terminations. These results were obtained using a two-port pseudo-differential measurement (i.e., unreleased diode of same area was fabricated next to device) with on-chip SOT de-embedding. The transmission magnitude data is shown in FIG. 4, indicating a mechanical quality factor of approximately 18,000 in vacuum for the fundamental mode. FIG. 6 illustrates a pseudo-differential transmission magnitude plot of RF MEMS device 100 in vacuum after SOT de-embedding demonstrating Q~18,000 at 3.72 GHz. Other than the device featured in this figure, we have successfully measured at least five other resonators all demonstrating $R_x<3$ k$\Omega$ and Q>15,000. Temperature measurements were also performed using a Lakeshore cryogenic vacuum probe station. FIG. 7 shows the temperature dependence of the resonant frequency, indicating a $TC_f=-9.72$ ppm/°C. over the temperature range of 5-75° C., which is about 3× lower than typical silicon micromechanical resonators.

Figure 8:
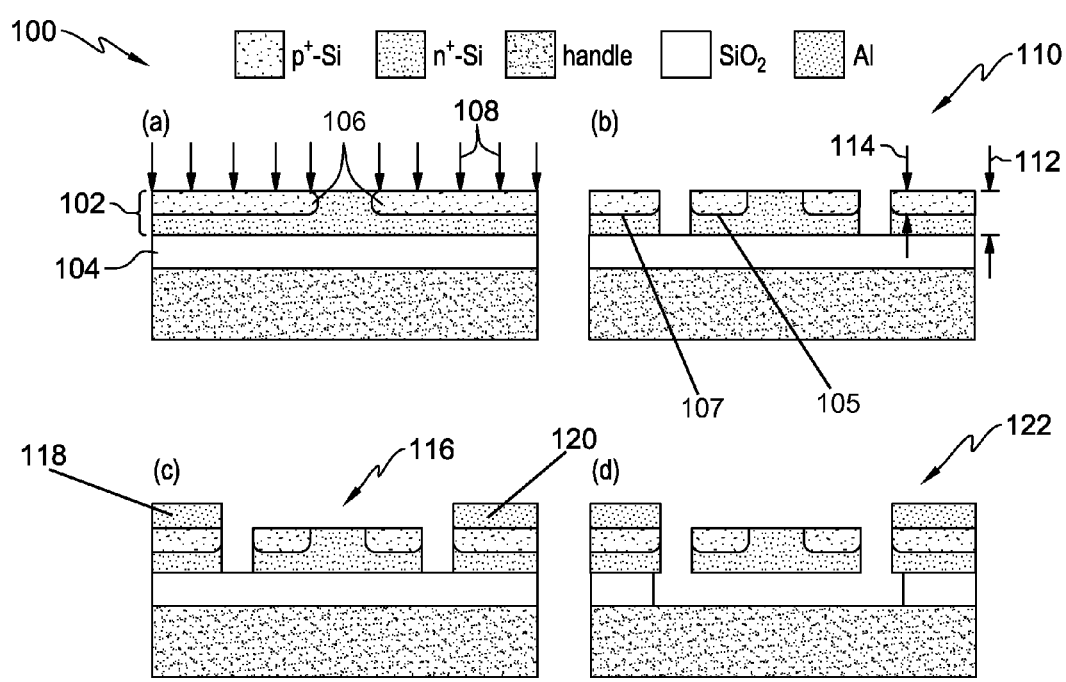
FIG. 8 schematically illustrates one embodiment of a method of manufacturing the RF MEMS device.

One embodiment of a method of manufacturing an RF MEMS device (122, FIG. 8(d)) is now being described with references to FIG. 8. In an exemplary embodiment, a custom n+ doped semiconductor-on-insulator (SOI) wafer 100 (i.e., semiconductor layer 102 on insulation layer 104) with 1.3 μm thick (114, FIG. 8(b)), (100)-oriented device layer 106 with resistivity <0.06$\Omega$-cm can be used for manufacturing the RF MEMS device. Initially, at step (a), the SOI wafer can be selectively doped using boron implantation 108 to create a p-n diode (110, FIG. 8(b)) including actuation 105 and sensing 107 junctions and to create ohmic contacts to metal interconnects.

Then, at step (b), the SOI wafer can then be annealed to achieve a desired junction depth 112. In an exemplary embodiment, a rapid thermal annealing at 1100° C. for 45 seconds can be used for dopant activation and to create the junction at the desired depth 114 of 0.65 μm.

Next, at step (c), the device layer can be etched to define a resonator 116 and two pads 118, 120. Then, interconnect and pad structures can be defined by depositing an etching a conductive layer (not shown). In an exemplary embodiment, the interconnect and pad structures can be defined by sputter deposition and wet etching of 50 nm chromium (for adhesion and to prevent spiking) and 100 nm aluminum.

Finally, at step (d), the device layer (122) can be released. In an exemplary embodiment, the device layer can be released using hydrogen fluoride (HF) etching.

While the present invention has been described with reference to a number of specific embodiments, it will be understood that the true spirit and scope of the invention should be determined only with respect to claims that can be supported by the present specification. Further, while in numerous cases herein wherein systems and apparatuses and methods are described as having a certain number of elements it will be understood that such systems, apparatuses and methods can be practiced with fewer than the mentioned certain number of elements. Also, while a number of particular embodiments have been described, it will be understood that features and aspects that have been described with reference to each particular embodiment can be used with each remaining particularly described embodiment.

REFERENCES

Citation of a reference herein shall not be construed as an admission that such reference is prior art to the present invention. The following references, to the extent that they provide exemplary procedural or other details supplementary to those set forth herein, are specifically incorporated herein by reference:

[1] H. C. Nathanson, W. E. Newell, R. A. Wickstrom, J. R. Davis, Jr., "The resonant gate transistor," IEEE Trans. Elec. Dev., 14 (3), pp. 117-133 (1967).

[2] D. Weinstein, S. A. Bhave, "Internal dielectric transduction of a 4.5 GHz silicon bar resonator," IEDM 2007, pp. 415-418.

[3] D. Grogg, M. Mazza, D. Tsamados, A. M. Ionescu, "Multi-gate vibrating-body field effect transistor (VB-FETs)," IEDM 2008, pp. 663-666.

The invention claimed is:

1. A method, comprising:
providing a radio frequency microelectromechanical (RF MEMS) device, the device comprising a semiconductor substrate;
an actuation p-n junction and a sensing p-n junction, each located within the semiconductor substrate at a point of minimum displacement with respect to a mechanical mode shape; and
actuating the actuation p-n junction at a resonant frequency, the actuating causing a mechanical motion in the actuation p-n junction, the mechanical motion causing a motional current in the sensing p-n junction,
wherein the mechanical mode shape is rectangular, wherein the point of minimum displacement for a harmonic n in the rectangular mode shape is equal to d/2n, and wherein d is a total length of the RF MEMS device in a main dimension of motion and n is an integer.

2. The method of claim 1, wherein both the actuating p-n junction and the sensing p-n junction are located at different points of minimum displacement.

3. The method of claim 1, wherein the actuating comprises applying an excitation voltage across the actuation p-n junction.

* * * * *